(12) United States Patent
Son

(10) Patent No.: US 8,816,477 B2
(45) Date of Patent: Aug. 26, 2014

(54) SEMICONDUCTOR PACKAGE HAVING A CONTAMINATION PREVENTING LAYER FORMED IN THE SEMICONDUCTOR CHIP

(75) Inventor: Ho Young Son, Chungcheongbuk-Do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/586,199

(22) Filed: Aug. 15, 2012

(65) Prior Publication Data

US 2013/0099360 A1 Apr. 25, 2013

(30) Foreign Application Priority Data

Oct. 21, 2011 (KR) .................. 10-2011-0108365

(51) Int. Cl.
*H01L 29/40* (2006.01)
(52) U.S. Cl.
USPC ............... 257/621; 257/E23.001; 438/667

(58) Field of Classification Search
USPC .......... 257/765–780; 438/655–665, 455–459
See application file for complete search history.

(56) References Cited

U.S. PATENT DOCUMENTS

| 6,171,661 | B1 * | 1/2001 | Zheng et al. .................. 427/535 |
| 6,194,076 | B1 * | 2/2001 | Matienzo et al. ............. 428/458 |
| 7,022,609 | B2 * | 4/2006 | Yamamoto et al. .......... 438/694 |
| 2004/0115921 | A1 * | 6/2004 | Clevenger et al. ............ 438/622 |
| 2006/0024941 | A1 * | 2/2006 | Son et al. ..................... 438/597 |
| 2007/0075425 | A1 * | 4/2007 | Morita et al. ................ 257/737 |
| 2010/0301485 | A1 * | 12/2010 | Sekine et al. ................ 257/769 |

* cited by examiner

*Primary Examiner* — Julio J Maldonado
*Assistant Examiner* — Robert Bachner
(74) *Attorney, Agent, or Firm* — William Park & Associates Patent Ltd.

(57) ABSTRACT

A semiconductor package includes a semiconductor chip having a front surface and a back surface facing away from the front surface; a through electrode formed in the semiconductor chip and passing through the front surface and the back surface; and a contamination preventing layer formed in the semiconductor chip, the through electrode passing through the contamination preventing layer.

14 Claims, 8 Drawing Sheets

SEMICONDUCTOR PACKAGE HAVING A CONTAMINATION PREVENTING LAYER FORMED IN THE SEMICONDUCTOR CHIP

CROSS-REFERENCE TO RELATED APPLICATIONS

The present application claims priorities to Korean patent application number 10-2011-0108365 filed on Oct. 21, 2011 and 10-2012-0016206 filed on Feb. 17, 2012, which are incorporated herein by reference in their entireties.

BACKGROUND OF THE INVENTION

The present invention relates to a semiconductor package, and more particularly, to a semiconductor package which can prevent diffusion of copper into a semiconductor chip and a method for manufacturing the same.

Recently, in order to improve data storage capacity and is data processing speeds of semiconductor packages, stack semiconductor packages comprising at least two stacked semiconductor chips have been developed using various structures.

The semiconductor chips of the stack type semiconductor package are electrically connected with one another, for example, by through electrodes which are formed to pass through the respective semiconductor chips.

However, in the stack type semiconductor package realized by connecting through electrodes, when forming bump pads on the back surface of each semiconductor chip, if the applied state of a barrier layer or an adhesive layer is poor, a problem is caused in that copper (Cu) of a copper seed layer and a copper plating layer is likely to diffuse into the semiconductor chip through the interface between a dielectric layer formed on the back surface of the semiconductor chip and the through electrodes.

Copper diffusion easily occurs not only in a process for forming the bump pads but also from copper which is pushed outward from the through electrodes exposed when grinding the back surface of the semiconductor chip.

Specifically, because copper may diffuse up to the circuit unit of the semiconductor chip and may cause malfunction of the circuit unit, reliability of the semiconductor package is degraded.

BRIEF SUMMARY OF THE INVENTION

An embodiment of the present invention is directed to a semiconductor package which can prevent copper (Cu) used in manufacturing of a semiconductor package from diffusing into a semiconductor chip.

Also, an embodiment of the present invention is directed to a method for manufacturing the semiconductor package.

Further, embodiments of the present invention are directed to a semiconductor module and an information processing system using the semiconductor package.

In one embodiment of the present invention, a semiconductor package includes: a semiconductor chip having a front surface and a back surface facing away from the front surface; a through electrode formed in the semiconductor chip and passing through the front surface and the back surface; and a contamination preventing layer formed in the semiconductor chip, the through electrode passing through the contamination preventing layer.

The contamination preventing layer may be an impurity layer including argon (Ar).

The contamination preventing layer may be disposed at a depth of 1~10 μm from the back surface of the semiconductor chip such that the contamination preventing layer is closer to the back surface than the front surface of the semiconductor chip.

The semiconductor package may further include an is isolation pattern formed on the back surface of the semiconductor chip into a shape which surrounds the through electrode.

The isolation pattern may be a groove which is defined by etching a portion of the back surface of the semiconductor chip between adjacent through electrodes and on the contamination preventing layer.

The isolation pattern may have the shape of a closed loop or a polygon when viewed from the top.

The semiconductor package may further include a back side bump formed on one end of the through electrode which is disposed on the back surface of the semiconductor chip.

The semiconductor package may further include a dielectric layer formed between the back surface of the semiconductor chip and the back side bump.

The semiconductor package may further include a front side electrode formed on an one end of the through electrode which is disposed on the front surface of the semiconductor chip.

In another embodiment of the present invention, a method for manufacturing a semiconductor package includes: preparing a semiconductor chip which has a front surface and a back surface facing away from the front surface; forming a contamination preventing layer in the semiconductor chip; forming a through electrode from the front surface of the semiconductor chip to a depth that passes through the contamination preventing layer; and is removing a portion of the back surface of the semiconductor chip to expose the through electrode.

The contamination preventing layer may be formed by implanting impurities including argon (Ar).

The through electrode may be formed to have a depth deeper by 1~10 μm than the contamination preventing layer when measured from the front surface of the semiconductor chip.

After the removing of the portion of the back surface of the semiconductor chip, the method may further include forming an isolation pattern which surrounds each through electrode, by etching the back surface of the semiconductor chip to expose the contamination preventing layer.

After the removing of the portion of the back surface of the semiconductor chip, the method may further include forming a dielectric layer on the back surface of the semiconductor chip; and forming an isolation pattern which surrounds each through electrode, by etching the dielectric layer and the back surface of the semiconductor chip to expose the through electrode and the contamination preventing layer.

The isolation pattern may be formed to have a shape of a closed loop or a polygon when viewed from the top.

After the forming of the isolation pattern, the method may further include forming a back side bumpon an other end of the through electrode which is disposed on the back surface of the is semiconductor chip.

The method may further include forming a front electrode on an one end of the through electrode which is disposed on the portion of the front surface of the semiconductor chip.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
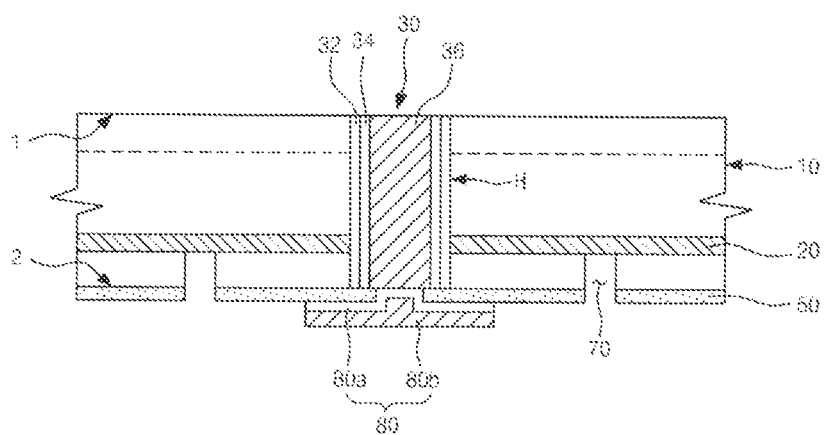
FIG. 1 is a cross-sectional view illustrating a semiconductor package in accordance with a first embodiment of the present invention.

FIG. 1 is a cross-sectional view illustrating a semiconductor package in accordance with a first embodiment of the present invention.

Referring to FIG. 1, the semiconductor package in accordance with the first embodiment of the present invention includes a semiconductor chip 10, a contamination preventing layer 20, a through electrode 30, a dielectric layer 50, an isolation pattern 70, and a back side bump 80.

The semiconductor chip 10 has a front surface 1, and a back surface 2 which faces away from the front surface 1. The semiconductor chip 10 includes a circuit unit formed therein. The is circuit unit includes circuits configured to operate by receiving external power and signals, for example, a data storage unit for storing data, a data processing unit for processing data, etc.

The contamination preventing layer 20 is formed in the vicinity of the back surface 2 in the semiconductor chip 10, and allows the through electrode 30 to pass therethrough. For example, the contamination preventing layer 20 is formed to be placed at the depth of 1~10 μm from the back surface 2 of the semiconductor chip 10 such that the contamination preventing layer is closer to the back surface 2 than the front surface 1 of the semiconductor chip 10. The contamination preventing layer 20 functions to prevent an external contamination source from diffusing into the semiconductor chip 10 from the back surface 2 of the semiconductor chip 10. That is to say, the contamination preventing layer 20 as an impurity layer including argon (Ar) and so forth prevents a contamination source, such as copper (Cu) of the through electrode 30 from diffusing from the back surface 2 of the semiconductor chip 10 to the circuit unit disposed in the semiconductor chip 10. Copper (Cu) from the through electrode 30 may diffuse from the back surface to the circuit unit when, for example, the semiconductor chip 10 is ground. Copper (Cu) may also diffuse from the back surface to the circuit unit from the back side bump 80 which is formed on the back surface 2 of the semiconductor chip 10.

The through electrode 30 passes through the front surface 1 and the back surface 2 of the semiconductor chip 10 and is electrically connected with the circuit unit. The through electrode 30 may have, for example, a column shape. Such the through electrode 30 has one end which is located on the front surface 1 of the semiconductor chip 10 and an other surface which is located on the back surface 2 of the semiconductor chip 10. The through electrode 30 includes a barrier layer 32 formed on side wall of a via H which is formed to pass through front surface 1 and back surface 2 of the semiconductor chip 10, a seed layer 34 formed on the barrier layer 32, and a plating layer 36 formed to fill the via H on the seed layer 34. Examples of a substance capable of being used to form the barrier layer 32 include at least one of Ti, Ta, TaN, TiWSi, WN and TaWSi. Examples of a substance capable of being used to form the seed layer 34 include at least one of copper, ruthenium and etc. metal. Examples of a substance capable of being used to form the plating layer 36 include copper, aluminum, gold and silver.

The dielectric layer 50 is formed on the back surface 2 of the semiconductor chip 10. Specifically, the dielectric layer 50 has an opening which exposes the other end of the through electrode 30 located on the back surface 2 of the semiconductor chip 10.

The isolation pattern 70 is formed in the shape of a groove which surrounds each through electrode 30. The isolation pattern may be formed by etching a portion of the dielectric layer 50 and a portion of the back surface 2 of the semiconductor chip 10 which are placed over the contamination preventing layer 20, such that adjacent through electrodes 30 are electrically isolated from one another. For example, the isolation pattern 70 may have the shape of a closed loop such as a ring, or the isolation pattern 70 may have the shape of a polygon such as a quadrangular frame when viewed from the top.

The back side bump 80 is disposed on the other end of the through electrode 30 which is disposed on the back surface 2 of the semiconductor chip 10. The back side bump 80 may, for example, comprise a stack structure of a seed layer 80a and a plating layer 80b.

Here, a typical back side bump is formed with a triple-layer structure of a barrier layer, a seed layer, and a plating layer. However, the back side bump 80 in the present invention can be formed with a double-layer structure of the seed layer 80a and the plating layer 80b without forming of the barrier layer in connection with a formation of the contamination preventing layer 20. Therefore, the present invention compared with prior art can be achieved a simplification of the back side bump structure.

The back side bump 80 may further include solders. The back side bump 80 serve as media which electrically connect the through electrodes 30 of stacked semiconductor chips with each is another when at least two semiconductor chips are stacked.

As is apparent from the above description, in the semiconductor package in accordance with an embodiment of the present invention, since a contamination preventing layer is formed in a semiconductor chip, it is possible to prevent copper (Cu) as a substance constituting a back side bump from diffusing into the semiconductor chip, whereby reliability of the semiconductor package may be improved.

Also, in the semiconductor package in accordance with an embodiment of the present invention, since an isolation pattern is formed to surround the periphery of each through electrode, it is possible to electrically isolate adjacent through electrodes from each other and adjacent back side bumps formed thereon from each other, whereby reliability of the semiconductor package may be further improved.

Hereafter, a method for manufacturing the semiconductor package in accordance with the first embodiment of the present invention will be described.

Figure 2A:
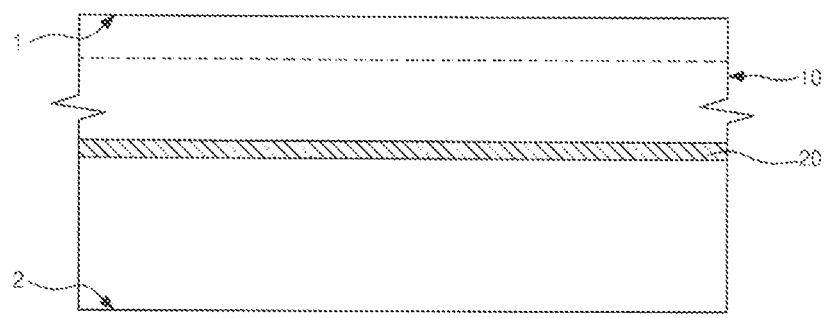
FIGS. 2A to 2E are cross-sectional views explaining processes of a method for manufacturing the semiconductor package in accordance with the first embodiment of the present invention.
Figure 2B:
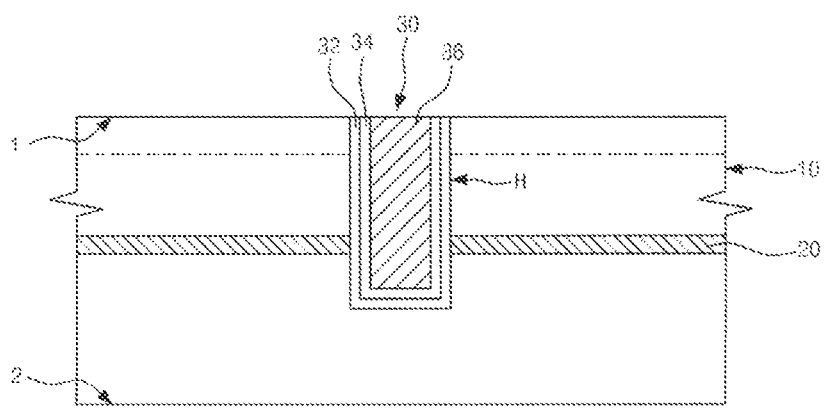
Figure 2C:
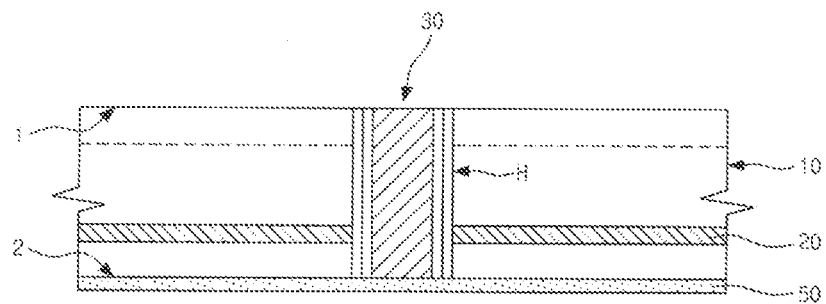
Figure 2D:
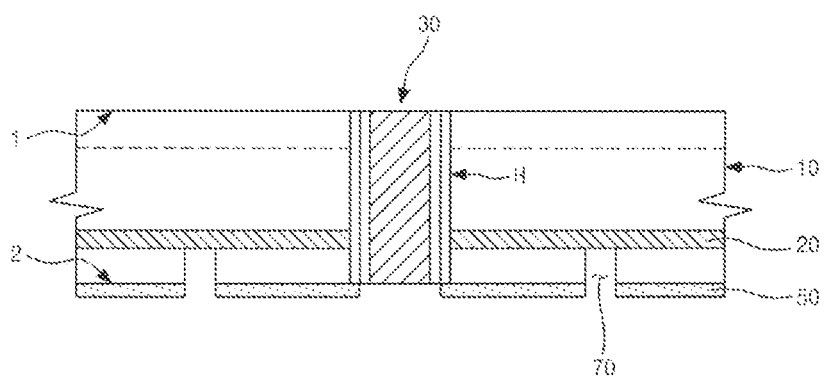
Figure 2E:
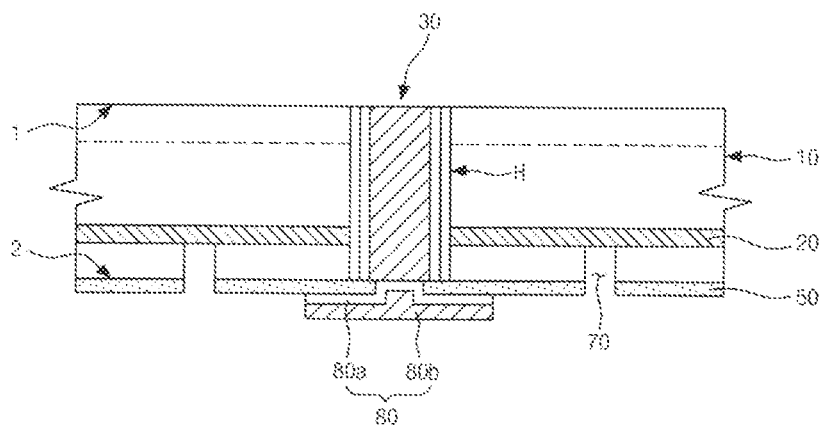
Figure 3:
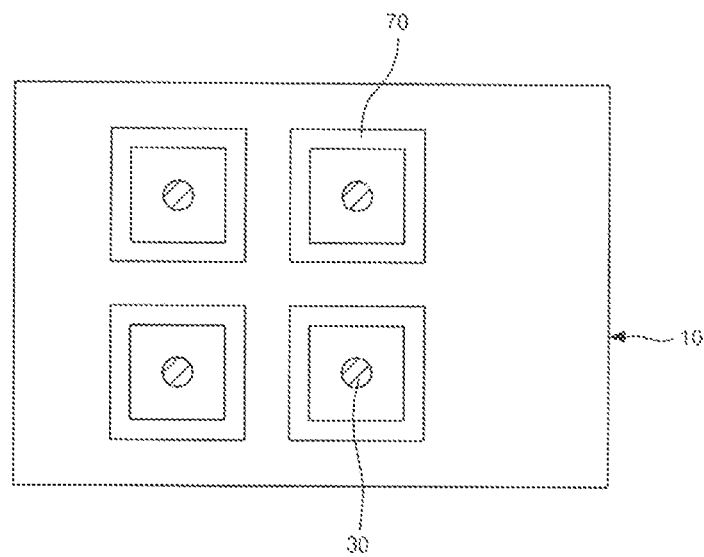
FIG. 3 is a plan view illustrating a back surface of the semiconductor chip shown in FIG. 2D.
Figure 4:
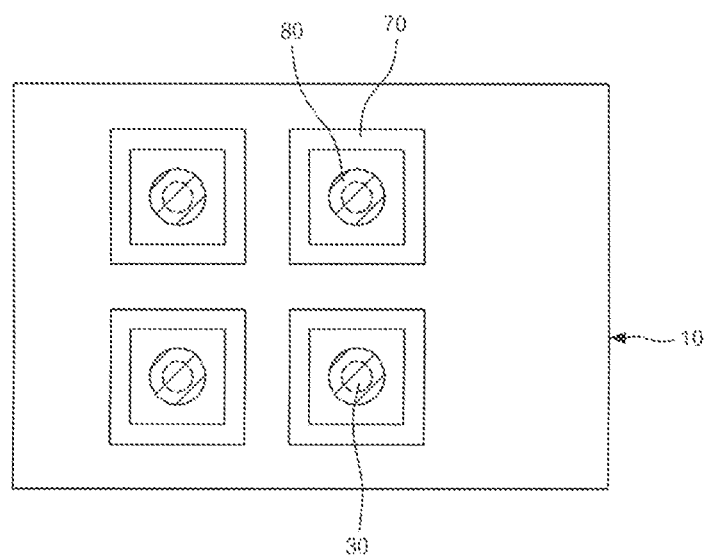
FIG. 4 is a plan view illustrating a back surface of the semiconductor chip shown in FIG. 2E.

FIGS. 2A to 2E are cross-sectional views explaining processes of a method for manufacturing a semiconductor package in accordance with the first embodiment of the present invention, FIG. 3 is a plan view illustrating a back surface of a semiconductor chip shown in FIG. 2D, and FIG. 4 is a plan view illustrating a back surface of a semiconductor chip shown in FIG. 2E.

Referring to FIG. 2A, a semiconductor chip 10 is prepared. The semiconductor chip 10 has a front surface 1 and a back surface 2 which faces away from the front surface 1, and is formed with a circuit unit therein through a semiconductor manufacturing process generally known in the art. The circuit unit may be understood as including a data storage unit and a data processing unit.

By implanting impurities including argon (Ar) into the semiconductor chip 10 from the front surface 1 thereof, a contamination preventing layer 20 is formed at a predetermined depth from the front surface 1 of the semiconductor chip 10. The contamination preventing layer 20 is formed with a band-like shape in the semiconductor chip 10 when viewed from a cross-section perspective.

Referring to FIG. 2B, the blind via hole H is defined from the front surface 1 toward the back surface 2 of the semiconductor chip 10, for example, through a dry etching process, a drilling process or a laser drilling process. The blind via hole H is defined to pass through the contamination preventing layer 20, to a depth deeper, for example, by 1~10 µm, than a lower surface of the contamination preventing layer 20.

Then, a barrier layer 32 for preventing diffusion of a copper (Cu) is formed on a side wall and a bottom surface of the blind via hole H and on the front surface 1 of the semiconductor chip 10. A seed layer 34 is formed on the barrier layer 32. A plating layer 36 is formed with a thickness capable of filling completely the blind via hole H, for example, through a plating process or a chemical vapor process. Here, the barrier layer 32 is formed at least any one of titanium (Ti), tantalum (Ta), titanium-nitride (TiN), tantalum-nitride (TaN), titanium-tungsten-silicon (TiWSi), tungsten-nitride (WN) and tantalum-tungsten-silicon (TaWSi), the seed layer 34 is formed at least any one of copper (Cu), ruthenium (Ru) and the others metal, and the plating layer 36 is formed at least any one of copper (Cu), aluminum (Al), gold (Au) and silver (Ag). Desirably, the plating layer 36 is formed with copper (Cu).

In succession, the through electrode 30 is formed in the blind via hole H, by removing portions of the plating layer 36, the seed layer 34, and the barrier layer 32 which is formed on the front surface 1 of the semiconductor chip 10. The through electrode 30 is formed to have a depth passing through the contamination preventing layer 20. For example, the through electrode 30 is formed to pass through the contamination layer 20 at least 1~10 µm deeper than the bottom surface of the contamination preventing layer 20 when measured from the front surface 1 of the semiconductor chip 10. The first bump pad 40 may include a solder.

Referring to FIG. 2C, the back surface 2 of the is semiconductor chip 10 is removed by a predetermined thickness through grinding and polishing processes. When the back surface 2 of the semiconductor chip 10 is processed, the portions of the barrier layer 32 and the seed layer 34 which is disposed on the bottom of the blind via hole H are removed together with. Then, a dielectric layer 50 is formed on the back surface 2 of the processed semiconductor chip 10.

Here, through the grinding process, the through electrode 30 is exposed on the back surface 2 of the semiconductor chip 10. Further, through the polishing process, a roughness of the back surface 2 of the semiconductor chip 10 having undergone the grinding process is decreased. Also, through the polishing process, a stress applied to the back surface 2 of the semiconductor chip 10 may be alleviated. Because the back surface 2 of the semiconductor chip 10 is removed by the predetermined thickness, the contamination preventing layer 20 is disposed at the depth of 1~10 µm when measured from the back surface 2 of the finally obtained semiconductor chip 10.

Referring to FIG. 2D, by coating, exposing and developing a photoresist layer on the dielectric layer 50, a photoresist pattern (not shown) is formed to expose a specified portion of the dielectric layer 50. Thereafter, the exposed portion of the dielectric layer 50 and a portion of the back surface 2 of the semiconductor chip 10 underneath thereof are etched using the photoresist pattern as an etch mask, and through this, the other end of the through electrode 30 which is located on the back surface 2 of the semiconductor chip 10 is exposed and simultaneously an isolation pattern 70 for isolating adjacent through electrodes 30 is defined. Next, the photoresist pattern used as the etch mask is removed.

The isolation pattern 70 is defined in the shape of a groove through etching of portions of the semiconductor chip 10 and the dielectric layer 50 which are placed on the contamination preventing layer 20. As shown in FIG. 3, the isolation pattern 70 is defined in a shape surrounding the through electrode 30 when viewed from the top. For example, the isolation pattern 70 is defined to have the shape of a closed loop such as a ring or a polygon such as a quadrangular frame.

Referring to FIG. 2E, a back side bump 80 is formed on the other end of the through electrode 30 which is located on the back surface 2 of the semiconductor chip 10 and an adjacent portion of the dielectric layer 50. The back side bump 80 is formed to have a double-layer structure of a seed layer 80a and a plating layer 80b without forming a barrier layer.

Here, since the contamination is formed in the portion adjacent to the back surface 2 of the semiconductor chip 10 and the isolation pattern 70 is formed, it is possible to prevent the diffusion of copper (Cu) into the semiconductor 10, whereby a formation of the barrier layer may be omitted. Therefore, the present invention is can achieve a simplification of the back side bump structure and a simplification of the manufacturing process to the back side bump.

Referring to FIG. 4 which is a plan view corresponding to FIG. 2E, the back side bump 80 is formed on the other end of the through electrode 30. The back side bump 80 may formed, for example, to have a circular shape when viewed from the top. It can be seen that adjacent back side bumps 80 are isolated from one another by the isolation pattern 70.

The processes of FIGS. 2A to 2E may be performed at a wafer level. Therefore, after the back side bump is formed, respective semiconductor chips formed with the back side bumps on the back surfaces thereof at the wafer level are sawed to a chip level, by which the manufacture of the semiconductor package in accordance with the first embodiment of the present invention is completed.

Figure 5:
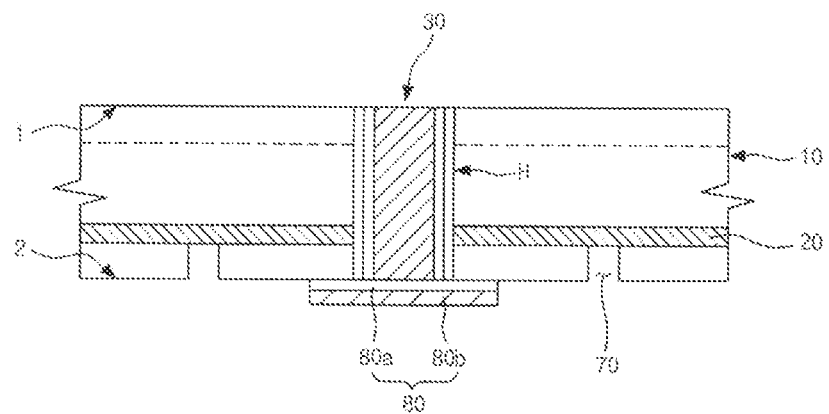
FIG. 5 is a cross-sectional view explaining a semiconductor package in accordance with a second embodiment of the present invention.

FIG. 5 is a cross-sectional view explaining a semiconductor package in accordance with a second embodiment of the present invention. Descriptions for the same component elements as those shown in FIG. 1 will be omitted herein, and only different features will be described below.

Referring to FIG. 5, the semiconductor package in accordance with the second embodiment of the present invention includes a semiconductor chip 10, a contamination preventing layer 20, a through electrode 30, an isolation pattern 70, and a back side bump 80.

The semiconductor package in accordance with the second embodiment of the present invention has a structure in which a dielectric layer is not formed on a back surface 2 of the semiconductor chip 10. Accordingly, a portion of the back side bump 80 may be in contact with the back surface of the semiconductor chip 10. In a typical semiconductor package structure which has the back side bump 80 on the back surface 2 of the semiconductor chip 10, if a dielectric layer is not formed, adjacent back side bumps 80 may be electrically short-circuited. However, in the present embodiment, because adjacent back side bumps 80 are electrically isolated from each other by the isolation pattern 70 formed to surround each through electrode 30 and the contamination preventing layer 20, there does not have to be a dielectric layer formed on the back surface 2 of the semiconductor chip 10.

Besides, the remaining component elements of the semiconductor package in accordance with the second embodiment of the present invention are substantially similar those of the semiconductor package in accordance with the first embodiment of the present invention.

In the semiconductor package in accordance with the second embodiment, since a contamination preventing layer is formed in the vicinity of a back surface of a semiconductor chip, it is possible to prevent a contamination source such as copper (Cu) from diffusing into the semiconductor chip, whereby the reliability of the semiconductor package may be improved.

Moreover, in the semiconductor package in accordance with embodiments of the invention, since an isolation pattern is formed to surround the periphery of each through electrode, it is possible to electrically isolate adjacent through electrodes from each other and adjacent back side bumps from each other, whereby the reliability of the semiconductor package may be further improved.

In addition, in the semiconductor package in accordance with the second embodiment of the present invention, since a process for forming a dielectric layer on the back surface of the semiconductor chip may be omitted through the formation of the contamination preventing layer and the isolation pattern, process simplification may be achieved.

Figure 6:
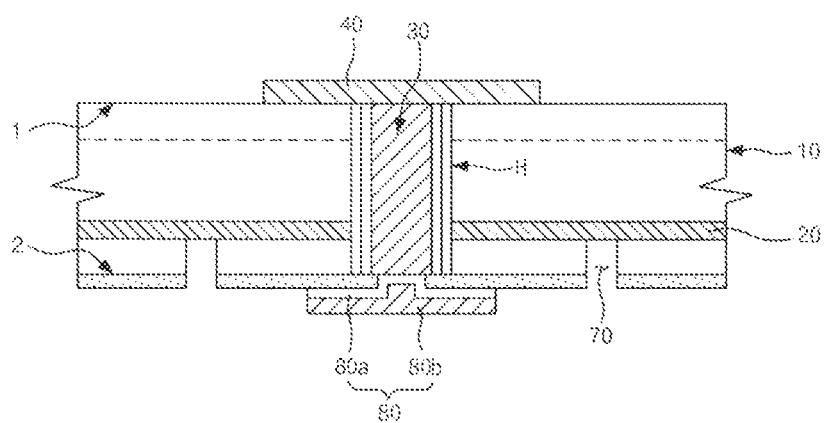
FIG. 6 is a cross-sectional view explaining a semiconductor package in accordance with a third embodiment of the present invention.

FIG. 6 is a cross-sectional view explaining a semiconductor package in accordance with a third embodiment of the present invention. Descriptions for the same component elements as those shown in FIG. 1 will be omitted herein, and only different features will be described below.

Referring to FIG. 6, the semiconductor package in accordance with the third embodiment of the present invention includes a semiconductor chip 10, a contamination preventing layer 20, a through electrode 30, an isolation pattern 70, a back side bump 80, and a front side bump 40.

Specifically, the semiconductor package in accordance with the third embodiment of the present invention has a structure in which the front side bump 40 is formed on the one end of the through electrode 30 which is disposed on the front surface 1 of the semiconductor chip 10. More particularly, the front side bump 40 is formed on the one end of the through electrode 30 and an adjacent portion of the front surface 1 of the semiconductor chip 10. The front side bump 40 may be formed at simultaneous and to one body with the through electrode 30. Also, the front side bump 40 may be formed additionally with the through electrode. The front side bump 40 may be formed with a non solder bump structure by using at least any one of copper (Cu), nickel (Ni), and gold (Au), or with a solder bump structure that tin (Sn)-based solder substance is disposed on at least any one of copper (Cu), nickel (Ni), and gold (Au). Also, the front side bump 40 may be formed with a pad structure by using at least ay one of Aluminum (A) and copper (Cu).

Besides, the remaining component elements of the semiconductor package in accordance with the third embodiment of the present invention are substantially similar those of the semiconductor package in accordance with the first embodiment of the present invention.

The semiconductor package according to embodiments of is the present invention may be applied to various package modules.

Figure 7:
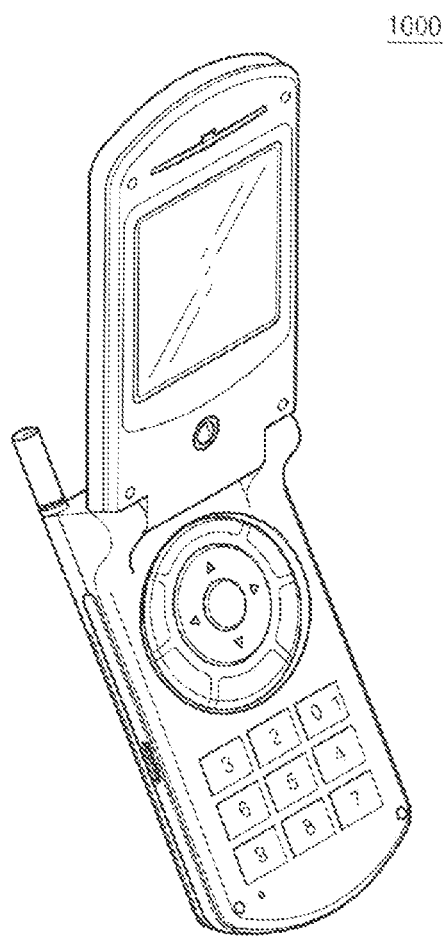
FIG. 7 is a perspective view illustrating an electronic apparatus having a semiconductor package according to an is embodiment of the present invention.

FIG. 7 is a perspective view illustrating an electronic apparatus having the semiconductor package according to the present invention.

Referring to FIG. 7, the semiconductor package according to embodiments of the present invention may be applied to an electronic apparatus 1000 such as a portable phone. In particular, since the semiconductor package according to embodiments of the present invention is excellent in terms of size reduction and electrical characteristics, it is advantageous for the light, thin, compact and miniaturized structure of the electronic apparatus 1000 which simultaneously performs various functions.

Meanwhile, the electronic apparatus 1000 to which the semiconductor package according to embodiments of the present invention is not limited to the portable phone shown in FIG. 6, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 8:
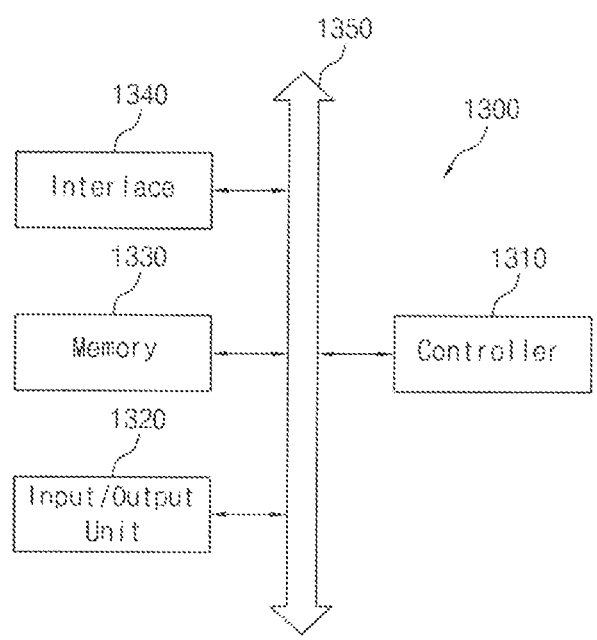
FIG. 8 is a systematic block diagram of an electronic apparatus to which the semiconductor package according to an embodiment the present invention is applied.

FIG. 8 is a systematic block diagram of an electronic apparatus to which the semiconductor package according to embodiments of the present invention is applied.

Referring to FIG. 8, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move.

For example, the controller 1310 may include at least any one of at least one microprocessor, at least one digital signal processor, at least one microcontroller, and logic devices capable of performing the same functions as these components. The controller 1310 and the memory 1330 may include a semiconductor package according to the present invention. The input/output unit 1320 may include at least one selected among a keypad, a keyboard, a display device, and so forth.

The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desktop computer. The flash memory may be constituted by a semiconductor disc device (SSD). In this case, the electronic system 1300 may stably store a large amount of data in a flash memory system.

The electronic system 1300 may further include an is interface 1340 configured to transmit and receive data to and from a communication network. The interface 1340 may be a wired or wireless type. For example, the interface 1340 may include an antenna or a wired or wireless transceiver.

Meanwhile, although not shown, the electronic system 1300 may be additionally provided with an application chipset, a camera image processor (CIS), an input/output unit, etc.

Although specific embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
   a semiconductor chip having a front surface and a back surface facing away from the front surface;
   a through electrode formed in the semiconductor chip and passing through the front surface and the back surface; and
   a contamination preventing layer formed inside the semiconductor chip, wherein the through electrode passes through the contamination preventing layer.

2. The semiconductor package according to claim 1, wherein the contamination preventing layer is an impurity layer including argon (Ar).

3. The semiconductor package according to claim 1, wherein the contamination preventing layer is disposed at a depth of 1~10 μm from the back surface of the semiconductor chip such that the contamination preventing layer is closer to the back surface than the front surface of the semiconductor chip.

4. The semiconductor package according to claim 1, further comprising an isolation pattern formed on the back surface of the semiconductor chip into a shape that surrounds the through electrode.

5. The semiconductor package according to claim 4, wherein the isolation pattern is a groove that is etched on the back surface of the semiconductor chip between adjacent through electrodes and on the contamination preventing layer.

6. The semiconductor package according to claim 4, wherein the isolation pattern has the shape of a closed loop or a polygon when viewed from the top.

7. The semiconductor package according to claim 1, further comprising a back side bump formed on an other end of the through electrode that is disposed on the back surface of the semiconductor chip.

8. The semiconductor package according to claim 7, further comprising a dielectric layer formed between the back surface of the semiconductor chip and the back side bump.

9. The semiconductor package according to claim 1, further comprising a front side bump formed on an one end of the through electrode that is disposed on the front surface of the semiconductor chip.

10. The semiconductor package according to claim 1, further comprising a barrier layer disposed on a side wall of the through electrode.

11. The semiconductor package according to claim 1, further comprising a seed layer disposed on one of a barrier layer and a side wall of the through electrode.

12. The semiconductor package according to claim 11, further comprising a plating layer disposed on the seed layer.

13. The semiconductor package according to claim 1, wherein the contamination preventing layer prevents metal from diffusing into the semiconductor chip.

14. The semiconductor package according to claim 1, wherein the contamination preventing layer comprises ion-implanted material inside the semiconductor package.

* * * * *